(12) United States Patent
Riva et al.

(10) Patent No.: US 11,331,647 B2
(45) Date of Patent: May 17, 2022

(54) HIGH-CAPACITY DISPENSABLE GETTER

(71) Applicant: SAES GETTERS S.P.A., Lainate (IT)

(72) Inventors: Miriam Riva, Lomazzo CO (IT); Paolo Vacca, Milan MI (IT)

(73) Assignee: SAES GETTERS S.P.A., Lainate (IT)

( * ) Notice: Subject to any disclaimer, the term of this patent is extended or adjusted under 35 U.S.C. 154(b) by 0 days.

(21) Appl. No.: 17/440,826

(22) PCT Filed: Feb. 9, 2021

(86) PCT No.: PCT/EP2021/053111
§ 371 (c)(1),
(2) Date: Sep. 20, 2021

(87) PCT Pub. No.: WO2021/160622
PCT Pub. Date: Aug. 19, 2021

(65) Prior Publication Data
US 2022/0088565 A1 Mar. 24, 2022

(30) Foreign Application Priority Data
Feb. 12, 2020 (IT) .................. 102020000002758

(51) Int. Cl.
| | |
|---|---|
| *B01J 20/06* | (2006.01) |
| *B01J 20/26* | (2006.01) |
| *B01J 20/28* | (2006.01) |
| *B01D 53/02* | (2006.01) |
| *B01D 53/26* | (2006.01) |
| *B01D 53/28* | (2006.01) |
| *B01J 20/18* | (2006.01) |
| *H01L 23/26* | (2006.01) |

(52) U.S. Cl.
CPC ............ *B01J 20/06* (2013.01); *B01D 53/02* (2013.01); *B01D 53/261* (2013.01); *B01D 53/28* (2013.01); *B01J 20/18* (2013.01); *B01J 20/262* (2013.01); *B01J 20/2803* (2013.01); *B01J 20/28004* (2013.01); *B01D 2253/108* (2013.01); *B01D 2253/1124* (2013.01); *B01D 2253/25* (2013.01); *B01D 2257/108* (2013.01); *B01D 2257/708* (2013.01); *B01D 2257/80* (2013.01); *B01D 2259/4525* (2013.01); *H01L 23/26* (2013.01)

(58) Field of Classification Search
CPC . B01J 20/06; B01J 20/18; B01J 20/262; B01J 20/28004; B01J 20/2803; B01D 53/02; B01D 53/261; B01D 53/28; B01D 2253/108; B01D 2253/1124; B01D 2253/25; B01D 2257/108; B01D 2257/708; B01D 2257/80; B01D 2259/4525; H01L 23/26
USPC ...................................... 252/181.2
See application file for complete search history.

(56) References Cited

U.S. PATENT DOCUMENTS 5,888,925 A 3/1999 Smith et al.

FOREIGN PATENT DOCUMENTS

| EP | 2561917 A1 | 2/2013 |
| EP | 2929934 A1 | 10/2015 |
| WO | WO-2006064289 A1 | 6/2006 |

OTHER PUBLICATIONS

International Search Report and Written Opinion dated Apr. 30, 2021 in PCT/EP2021/053111, 14 pages.

*Primary Examiner* — Edward M Johnson
(74) *Attorney, Agent, or Firm* — Element IP, PLC

(57) ABSTRACT

High-capacity dispensable moisture and hydrogen getter to be used as sealant and/or to control the level of these substances in electronic or optoelectronic sensitive devices, its use for the hermetic sealing or semi-hermetic sealing of such electronic or optoelectronic sensitive devices and a method to control the level of contaminants within them.

13 Claims, 2 Drawing Sheets

HIGH-CAPACITY DISPENSABLE GETTER

Figure 1:
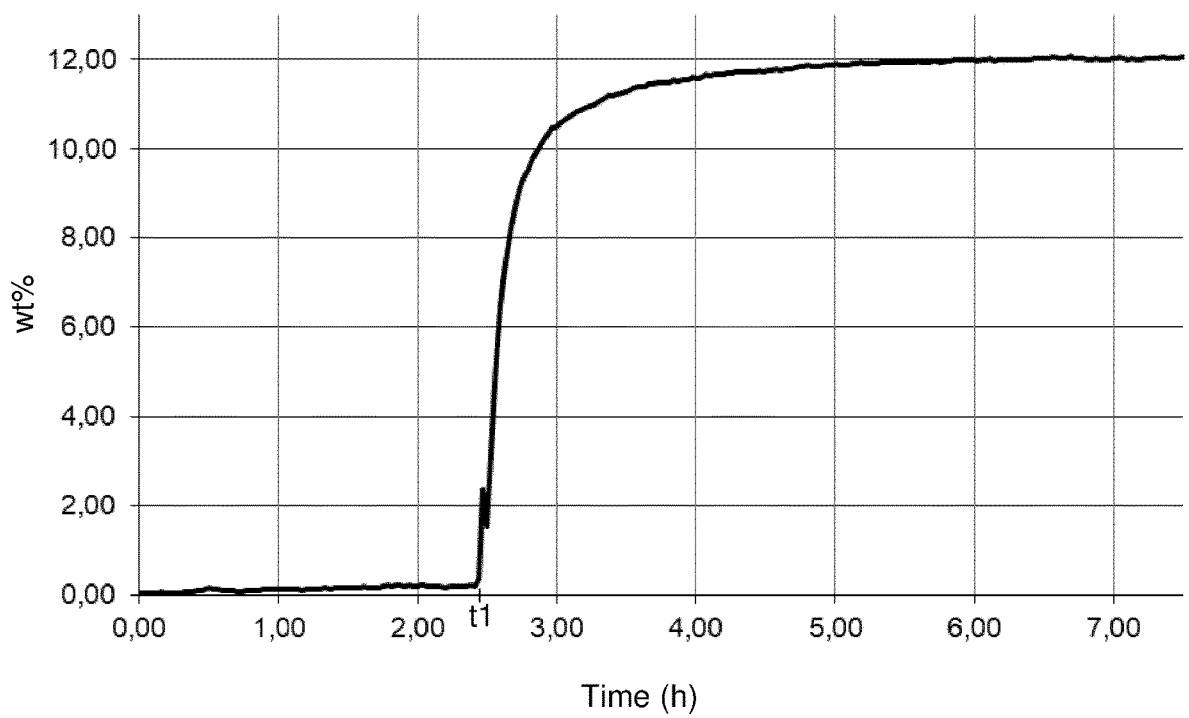

The present invention relates to a high-capacity dispensable moisture and hydrogen getter to be used to control the level of these substances for example in electronic or optoelectronic devices.

The presence of moisture and hydrogen even at low levels (in general amounts as low as 5000 ppm of moisture and 1000 ppm of hydrogen are considered critical) is detrimental for the operation of most hermetically sealed devices. Their concentration inside the devices increases over time due to external contributions such as permeation from the external environment into the devices through the case/sealing element, as a perfect hermeticity is an ideal and a non-achievable condition, and to internal contribution, mainly outgassing from device components.

Various literature references describe the detrimental role of hydrogen and moisture in hermetically sealed devices. For example, Albarghouti et al. "Moisture and Hydrogen Release in Optoelectronic Hermetic Packages", Journal of Microelectronics and Electronic Packaging (2014) 11, 75-79 disclose that one unfavorable moisture effect in optoelectronic hermetic packages is the penetration and dwelling of moisture in microcracks, which causes a hermeticity problem when this moisture freezes and expands. Moreover, hydrogen, with its affinity to oxygen, can react with surface oxides inside hermetic packages and cause the formation of moisture. The white paper "Reliability Issues for Optical Transceivers" by DfR Solutions highlights corrosion due to trapped hydrogen in metallized Kovar packages and device component moisture sensitivity for optical transceivers. Also components that appear largely and mainly affected from hydrogen, such as optical fibers cable, benefit from the presence of a combined hydrogen and moisture absorber, as moisture itself can be the hydrogen source in the cable see, for example, the 2004 white paper WP9007: "The Impact of Hydrogen on Optical Fiber" by Corning with regards to the detrimental role of hydrogen, and Ohnishi et al. "Loss stability assurance against hydrogen for submarine optical cable", Journal of Lightwave Technology, issue 2 (1988).

Thin film transistors (TFTs) are also reported like a type of devices where the combined effect of moisture and hydrogen can induce a fast degradation of electrical properties. Nam et al. reported in *RCS Adv.* 2018, 8, 5622-5628 that hydrogen impurities affect the electrical properties of TFTs based on amorphous oxide semiconductors. Moreover, Lee and Jeong described for the same type of devices a severe decreasing of field-effect mobility when exposed to high-humidity conditions (IEEE Journal of the Electron Devices Society (2019, 7, 26-32).

Another type of devices where the concurrent presence of hydrogen and moisture is detrimental are spatial light modulators as described in U.S. Pat. No. 6,958,846.

The negative effects of hydrogen and moisture also on microwave modules or hybrid modules are explained in the technical pages reported at the links https://www.microwaves101.com/encyclopedias/hybrid-modules and https://www.microwaves101.com/encyclopedias/hermeticity.

The problems linked to the hydrogen and moisture presence in sealed electronic devices and components are described in US 2016/0175805 that discloses the addition of a suitable binder to consolidate the composite getter in a tablet form.

One of the critical aspects to take into account is also the amount of getter to be added to ensure the required device lifetime, because getter capacity is clearly linked to the amount of getter material. However, in view of the constant miniaturization trend, decreasing the available space, getters in form of tablet are unsuitable for electronic devices, especially for the newly developed devices such as, for example, communication chips for the latest standards (5G) described in WO2019/066987.

U.S. Pat. No. 5,888,925 describes a hydrogen and moisture getter suggesting the use of a binder, e.g. vulcanized silicone, to hold the getter and conform to certain shapes, but again without tackling the problem of maximizing the amount of getter material which can be included in a dispensable solution.

Therefore, in the manufacturing of hermetically sealed devices, it would be very useful to have compositions which scavenge water and/or hydrogen, generally referred to in the art and herein as "getters" allowing for an easy distribution of adequate amounts of getter material and an easy integration thereof in the manufacturing process of the above-mentioned devices. In the context of the present invention, the term "dispensable" means also "spreadable" and it is used to indicate a composition which can be easily dispensed, spread, distributed or deposited onto a variety of surfaces and/or into a variety of shapes and which can also easily be integrated into devices of the type herein described. The term dispensable composition, according to the present invention, can also mean composition having a viscosity, before curing, comprised between 40.000 cP and 90.000 cP at 50 $sec^{-1}$ shear rates.

The advantage of the getter composition of the present invention is its dispensable feature, allowing for its easy integration, and at the same time a high sorption capacity ensuring its advantageous employ in the most demanding devices, also in light of new standard communication adoption (5G) and associated new technical requirement and constrains. Exemplary devices where the use of the solution of present invention is particularly beneficial are optical transceivers, with particular reference to so called high-speed optical transceivers (i.e. device with data transfer speed reaching more than 100 Gbps), optical receivers, microwave GaAs-based modules.

Dispensable getter compositions have been known in the art for a long time, see for example U.S. Pat. No. 5,244,707 generally disclosing the use of powders dispersed in a suitable matrix, U.S. Pat. No. 5,997,829 disclosing a mix of metal oxides and adsorbent particles dispersed in a suitable matrix or U.S. Pat. No. 9,845,416, in the applicant's name, describing a dispensable adhesive based on an epoxy resin with no active material contained therein.

One purpose of the present invention is thus to overcome the limits of getter-based solutions known in the art by providing a dispensable high-capacity moisture and hydrogen getter.

Therefore, a first aspect of the present invention is a dispensable getter composition comprising a binder, a moisture sorber and a hydrogen sorber, wherein:

the hydrogen sorber is palladium oxide in an amount comprised between 5 wt % and 25 wt % of the weight of the dispensable getter composition;

the moisture sorber is a zeolite in an amount comprised between 35 wt % and 55 wt % of the weight of the dispensable getter composition; and the organic binder is in an amount comprised between 30 wt % and 50 wt % of the weight of the dispensable getter composition, up to 10 wt % and preferably up to 5 wt % of additional materials such as thermal curing agents, pigments, and stabilizers, preferably the thermal curing agent amount being no less than 1 wt %, characterized in that said organic binder is a bisphenol resin chosen from type F, type S or their combination.

The dispensable composition of the invention may comprise also getters for other impurities, such as volatile organic compounds (VOCs) in any case within the 10 wt % limit, 9 wt % or less in the preferred case of a curing agent in an amount equal or higher than 1 wt %. Most common VOCs are benzene, toluene, xylene, heptene, heptane, dodecane, undecane, their alkyl (e.g. methyl) derivatives, ethylene glycol and other ethers, aldeydes, formaldehyde, ketons, amines, methylene chloride, tetrachloroethylene, 1,3-butadiene and other conjugated dienes, silanols and their alkyl derivatives.

The getter compositions of the present invention are capable to achieve a moisture capacity comprised between 8 and 15 wt % and a hydrogen capacity comprised between 20 and 60 torr liter/grams, and at the same time maintain the feature of being dispensable by the most common technique and equipment, i.e. their viscosity is comprised between 40.000 and 90.000 cP at 50 sec$^{-1}$ shear rates.

The invention is not limited to a specific thermal curing agent or a specific class of curing agents, but any curing agent compatible with a bisphenol resin may be used, such as primary and secondary amines (aliphatic, alicyclic and aromatic), organic anhydrides, or polyamides. It is to be underlined that the choice of a suitable curing agent is an information that is readily available to a person of ordinary skill in the art, and can be easily retrieved, see for example the 1980 book "FRP Technology Fibre Reinforced Resin Systems" by R. G. Weatherhead, Applied Science Publishers LTD London Editor with particular reference to its chapter 12 "Curing agents for epoxide resins", from page 266 to 283.

It is also to be underlined that the term curing agent is analogous to crosslinking element. Suitable curing agents/crosslinking elements are, for example, polyfunctional amines, acid anhydrides, phenols, alcohols and thiols.

Figure 2:
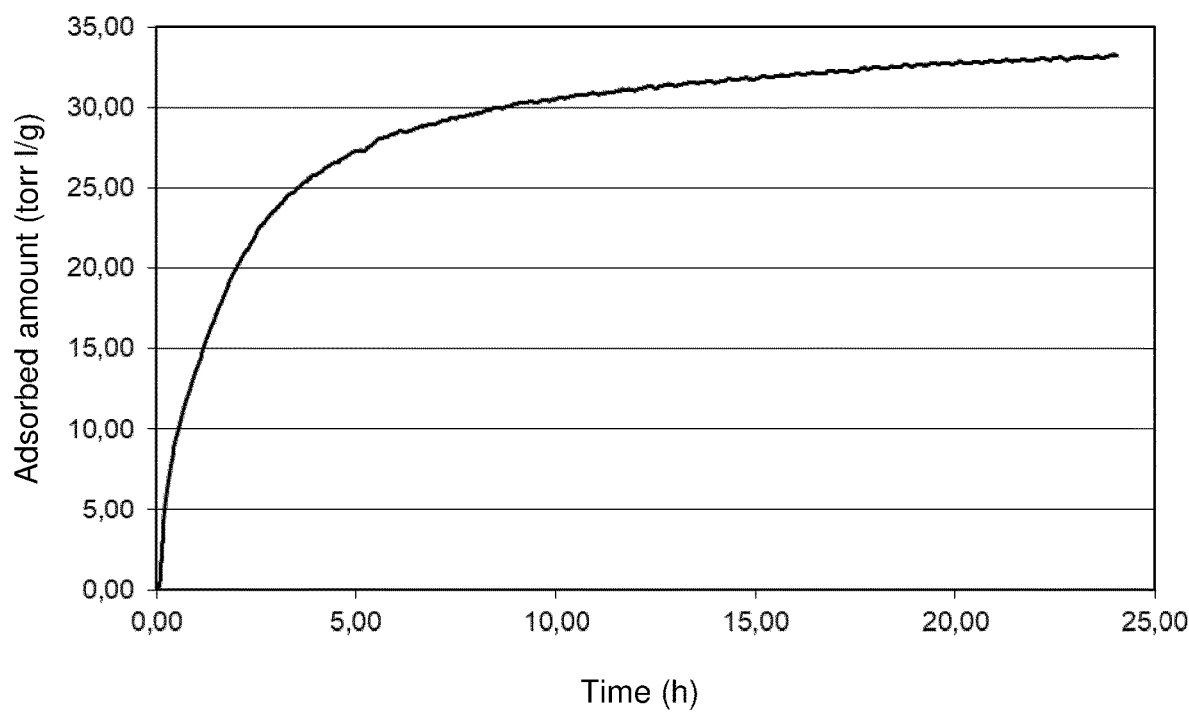

The invention will be further illustrated with the help of the following figures where:

FIG. 1 is a chart showing the result of a moisture capacity test for a dispensable getter sample made according to the present invention, and FIG. 2 is a chart showing the result of a hydrogen capacity test for a dispensable getter sample made according to the present invention.

The inventors have surprisingly found that even with the addition of a cumulative high amount of moisture and hydrogen getter (no less than 40 wt %) by using specific bisphenol resins, chosen between F, S or mixtures thereof, a proper viscosity is achieved allowing the getter of the present invention to be supplied in syringes to be mounted and used in standard dispensing equipment. This is possible as the dispensable getter of present invention typically has a viscosity (obviously before curing) comprised between 40.000 centipoise cP and 90.000 cP at 50 sec−1 shear rates. This result was not foreseeable apriori as per comparative example illustrated later on.

Other additional advantages of present invention are: the composite getter does not envision the use of environmentally hazardous solvents; it could be dispensed in air with no significant hampering of its hydrogen capacity and only a partial saturation of moisture capacity (50% loss after 10 min air exposure for a dispensed getter layer); moisture sorption capacity can be completely restored through a thermal process such as, for example, heating at 100° C.-150° C. for 1-3 hours.

The moisture sorber is a zeolite and preferably is a Linde Type A zeolite (LTA), and in a further embodiment said LTA zeolite is combined with at least one zeolite selected in a group consisting of Faujasite, MFI and Mordenite. According to the invention the moisture sorber can be in the form of particles with a size (diameter) less than 10 μm for at least 90% of the particles; as the dispensable getter composition is highly uniform, the above sizing condition can be verified over any 1 g of dispensable getter composition according to any of the embodiments herein disclosed.

The hydrogen sorber is palladium metal oxide in the form of particles with a size (diameter) less than 15 μm for at least 90% of the particles; as the dispensable getter composition is highly uniform, the above sizing condition can be verified over any 1 g of dispensable getter composition.

As the particles may not be perfectly spherical their diameter is intended as the diameter of the enclosing sphere, in order to determine the equivalent spherical diameter. The distribution is to be assessed in number and any suitable technique, such as the use of commercially available laser diffraction instruments can be employed.

It is to be underlined that although the dispensable getter compositions of present invention are most usefully adopted in hermetic devices, they can also usefully be adopted in the so-called semi-hermetic devices.

Hermetic devices are defined according to standard TM 1014.11 based on their leak rate, more in details are hermetic devices those who have:
- Less than $5*10^{-8}$ atm cc/s air for volumes of 0.01 cc or less
- Less than $1*10^{-7}$ atm cc/s air for volumes of 0.01 cc to 0.4 cc
- Less than $1*10^{-6}$ atm cc/s air for volumes of 0.4 cc or greater Whereas, although a rigorous definition of semi-hermetic devices does not exist, for the purpose of present invention they can be considered as devices with an air leak rate being no more than two orders of magnitude higher with respect to hermetic devices.

The composition according to any one of the embodiments disclosed above, can be used to seal or fill a device, preferably an electronic or optoelectronic device, and/or to control the level of contaminants such as, for example, hydrogen and moisture within said device. Alternatively, the composition according to any one of the embodiments disclosed above can be used to obtain a deposit of getter over a support surface, the support being advantageously used, for example, as part of the device package or enclosure. Therefore, the present invention also refers to the use of the composition according to any one of the embodiments disclosed therein to seal or fill a device, preferably an electronic or optoelectronic device, or to provide a getter deposited support or support surface to be included therein, thereby controlling the level of contaminants within the device.

In particular, the dispensable getter composition of the present invention can be used within hermetic devices, for example, as active deposit or even as filler, and/or as a (active) sealant in semi-hermetic devices.

In a second aspect thereof, the invention covers the use of a dispensable getter composition comprising a binder, a moisture sorber and a hydrogen sorber, wherein:
  the hydrogen sorber is palladium oxide in an amount comprised between 5 wt % and 25 wt % of the weight of the dispensable getter composition,
  the moisture sorber is a zeolite in an amount comprised between 35 wt % and 55 wt % of the weight of the dispensable getter composition the organic binder is in an amount comprised between 30 wt % and 50 wt % of the weight of the dispensable getter composition, the organic binder is a bisphenol resin chosen from 4,4'-methylenediphenol (bisphenol type F), 4,4'-sulfonyldiphenol (bisphenol type S) or mixtures thereof, up to 10 wt % and preferably up to 5 wt % of additional materials such as curing agents, pigments, stabilizers, the curing agent amount being preferably no less than 1 wt %, to obtain a cured consolidated deposit of getter over a support surface, the support being advantageously used as part of the device enclosure.

Obviously after curing, the dispensed getter composition shall present only a negligible amount of unreacted curing agent. As a consequence of the curing process the bisphenol will transform into an epoxy resin with very limited flowing characteristics, namely with a viscosity being no less than 500.000 cP at 50 sec-1 shear rates.

The getter can be, for example, deposited over a surface of the support (the one that will be exposed to the inner part of the device). Therefore, another aspect of the present invention is a support or support surface covered with or having thereon the getter composition according to any one of the embodiments disclosed therein. Suitable surface supports materials are for example, silicon, glass, polyamide, polyimide, polyethylene naphthalate, cyclic olefin copolymers and other polymer substrate or metals with suitable thermal stability. Preferable metallic or metallized supports are Kovar, gold plated Kovar, gold plated iron, nickel plated iron. In some embodiments the whole support is made with the above listed materials, in other its bulk is made with a different material and only its surface where the getter is to be deposited is made with the above listed materials.

Most useful formats for the cured getter deposit are the ones having an average thickness comprised between 100 µm and 300 µm, whereas the area is a parameter strongly linked to the sensitive device and its dimension and it is not a characterizing feature of the invention but of the device itself.

Preferably the support with the consolidated deposit of getter material is used or is part of the device lid.

The use of a support coated with or having a cured dispensable getter composition according to the present invention is advantageous as it allows the device manufacturer to just integrate the support in the manufacturing process of the device, and therefore does not need dispensing and curing equipment (off-line getter integration).

A support with the cured dispensable getter can thus be seen as a semi-finished product to be shipped to the device manufacturer, in this regards the dispensable feature (before curing) is still an interesting feature as it allows to easily manufacture different formats for integration in different types of devices or devices having different size or different requirements in amounts of material.

In a third aspect thereof, the present invention covers a method to control the level of contaminants inside a sensitive device with a dispensable getter composition comprising an organic binder, a moisture sorber and a hydrogen sorber, wherein:

the hydrogen sorber is palladium oxide in an amount comprised between 5 wt % and 25 wt % of the weight of the dispensable getter composition, the moisture sorber is a zeolite in an amount comprised between 35 wt % and 55 wt % of the weight of the dispensable getter composition the organic binder is in an amount comprised between 30 wt % and 50 wt % of the weight of the dispensable getter composition, the organic binder is a bisphenol resin chosen from 4,4'-methylenediphenol (bisphenol type F), 4,4'-sulfonyldiphenol (bisphenol type S) or mixtures thereof, up to 10 wt % and preferably up to 5 wt % of additional materials such as curing agents, pigments, stabilizers, the curing agent amount being preferably no less than 1 wt %.

The term "sensitive devices" indicates an electronic or optoelectronic device whose performances or lifetime are impaired by the presence of relatively high level of moisture or hydrogen, such as level higher than 5000 ppm (parts per million) for moisture or higher than 1000 ppm for hydrogen. Exemplary devices are optical transceivers, transmitters, receivers, amplifiers, laser diodes, multiplexers, photodiodes, RF devices, microwave modules or hybrid modules.

The present invention also refers to a method which envisions the use of the dispensable getter as active sealant and/or filler for the device or as getter inside the device with no particular adhesion function, i.e. the sorption function is taken care by the dispensable getter of present invention and is de-coupled from the sealing function.

Therefore, another object of the present invention is a method to seal or fill a device, preferably a hermetic or a semi-hermetic device, and/or to control the level of contaminants therein, comprising dispensing the dispensable getter composition, according to any one of the embodiments herein disclosed, over one or more surfaces of the device, inside the device, and/or onto a support or support surface to be included in said device; and then subjecting to curing the device, the support or the surfaces thereof, respectively.

According to an embodiment of the invention, the cured getter composition is isolated from the environment outside of the electronic device and has an average thickness comprised between 100 µm and 300 µm or wherein the cured dispensable getter composition is in contact with the environment outside the electronic device and has an average thickness comprised between 1 mm and 4 mm.

According to an embodiment of the invention, when applied as dispensable getter sealant, the term sealant refers to the disposition of the dispensable getter composition in the electronic devices package, namely as element interposed between the inner volume of the sensitive device and the external environment. In this regard, it is important to underline that the sealant according to the present invention may be in direct contact with the outside of the device or could be in contact with another element, such a getter less sealant as described in the already mentioned U.S. Pat. No. 9,845,416 in the applicant's name.

The high-capacity dispensable moisture and hydrogen getter of the present invention is usually supplied in syringes and dispensed by means of a needle dispensing tool and then subjected to a curing process, typically by thermal curing, with temperatures ranging from 100° C. up to 250° C. for durations comprised between 0.5 hours and 4 hours, obviously the lowest the temperature the higher the duration of the curing process. The invention is not limited to this specific dispensing technique, but also others such as doctor blading, bar coating, slot die coating, screen printing may be usually employed.

When the method envisions the use as a getter (no sealing function) the dispensable composition of the present invention after curing has the form of a continuous deposit of material with average thickness preferably comprised between 100 and 300 μm and an area scaling with the sensitive device dimension; whereas when used as active sealant the average thickness is preferable comprised between 1 and 4 mm.

One of the advantages of the dispensable getter composition and of the method of controlling the level of contaminants by its use is that it allows the possibility to choose the best way to integrate the getter, by a semi-finished product (deposited support) if the device manufacturer does not have the required equipment (off-line solution), or with a dispensable solution easily implementable through standard dispensing equipment (in-line solution).

The invention will be further illustrated with the help of the following non-limiting examples.

Preparation of Sample S1 According to Present Invention 10 grams of dispensable getter composition according to the present invention were prepared adding 1.5 grams of palladium oxide particles with diameter less than 10 μm (90% in number) and 4.5 grams of LTA type zeolites particles, with diameter less than 10 μm (90% in number) to a bisphenol F matrix containing 0.4 grams of cyanate ester as curing agent.

The dispensable getter composition was then subject to a speed mixing process for getting a homogenous composition/particle distribution, later on subjected to a mill rolling process.

Part of the dispensable getter composition is then inserted into a 3 cc syringe and deposited onto an aluminum foil as a series of ten 9×5 mm rectangles having an average height of 100 μm and another part kept for rheology property testing.

The foil is then subjected to curing by a two-step heating process first one heating at 150° C. for 1 hour followed to a final one of 200° C. for 1 hour. The foil is then cut into samples each containing a single getter deposit activated at high temperature, 100° C. for 3 hours under vacuum. This further step of activation to remove the physisorbed water by zeolites during the sample preparations.

Preparation of Comparative Sample C1

10 grams of dispensable getter composition outside the scope of present invention were prepared adding 0.4 grams of palladium oxide particles with diameter less than 10 μm (90% in number) and 3.0 grams of LTA type zeolites particles, with diameter less than 10 μm (90% in number) to a bisphenolAdiglycidylether and methylphthalic anhydride epoxy resin. The dispensable getter composition was then subject to a speed mixing process for getting a homogenous composition/particle distribution, later on subjected to a mill rolling process.

Preparation of Comparative Sample C2

10 grams of dispensable getter composition outside the scope of present invention were prepared adding 0.4 grams of palladium oxide particles with diameter less than 10 μm (90% in number) and 1.5 grams of LTA type zeolites particles, with diameter less than 10 μm (90% in number) to a bisphenolAdiglycidylether and methylphthalic anhydride epoxy resin. The dispensable getter composition was then subject to a speed mixing process for getting a homogenous composition/particle distribution, later on subjected to a mill rolling process.

Moisture Capacity Test of Sample S1

4 out of the 10 samples were concurrently tested in a microbalance kept under dynamic condition exposing them, at room temperature, to a 5 mbar partial pressure up to saturation regime, achieving an overall capacity of 12 wt %.

FIG. 1 shows the results of the above test, with t1 indicating the starting time of the exposure to the 5 mbar moisture pressure.

Hydrogen Capacity Test of Sample S1

4 out of the 10 samples were concurrently tested at room temperature in a volumetric bench at constant 8 torr pressure of pure hydrogen, up to saturation regime, and the overall capacity of the tested samples was 33 torr liter/grams, corresponding to a relative weight increase in the composite getter of 0.36 wt %.

FIG. 2 shows the results of the above test.

The much lesser weight increase due to hydrogen capture with respect to moisture is linked to the lower molecular weight of the hydrogen as well as to the sorbers ratio chosen for the preparation of sample S1.

Rheological Property Test

Rheological properties of sample S1 made according to present invention (made using Bisphenol F) are compared with comparative examples C1 and C2 (both made using Bisphenol A). Following table 1 reports the sample loading of sorber materials and the measured rheological properties.

TABLE 1

| Sample | PdO (% wt) | LTA zeolites (% wt) | Viscosity (cP) at 50 Sec$^{-1}$ |
|---|---|---|---|
| S1 | 15 | 45 | 60.000 |
| C1 | 4 | 30 | 190.000 |
| C2 | 4 | 15 | 110.000 |

Samples reported in Table 1 are tested by rheological analysis to determine the viscosity at 50 sec$^{-1}$ shear rates. Typically, dispensing techniques, such as needle dispensing, require a materials viscosity ranging from 10.000 up to 90.000 cP at 50 sec−1 shear rates. As evident from the results, sample S1 presents a good viscosity with a high amount of moisture and hydrogen getter, respect to comparative examples C1 and C2, characterized by high viscosity with a low getter loading.

It is possible to observe that even with a reduced loading of sorber material, for both the hydrogen and moisture sorbers, the comparative samples C1 and C2 where both outside the above-mentioned range useful for the most common dispensing techniques.

The invention claimed is:

1. A dispensable getter composition, comprising:
   an organic binder;
   a moisture sorber; and
   a hydrogen sorber,
   wherein:
   the hydrogen sorber is palladium oxide in an amount comprised between 5 wt % and 25 wt % of the weight of the dispensable getter composition;
   the moisture sorber is a zeolite in an amount comprised between 35 wt % and 55 wt % of the weight of the dispensable getter composition; and
   the organic binder is in an amount comprised between 30 wt % and 50 wt % of the weight of the dispensable getter composition;
   the dispensable getter composition further comprising up to 10 wt % of an additional material selected from thermal curing agents, pigments, and stabilizers,
   wherein said organic binder is a bisphenol resin selected from type F, type S or mixtures thereof.

2. The dispensable getter composition according to claim 1, wherein the additional material comprises up to 9 wt % of a VOCs getter.

3. The dispensable getter composition according to claim 1, wherein the moisture sorber is a LTA zeolite.

4. The dispensable getter composition according to claim 3, wherein the LTA zeolite is combined with at least one zeolite selected from the group consisting of Faujasite, MFI, and Mordenite.

5. The dispensable getter according to claim 1, wherein the moisture sorber is in the form of particles, wherein at least 90% of the particles are below 10 µm.

6. The dispensable getter according to claim 1, wherein the palladium oxide is in the form of particles, wherein at least 90% of the particles are below 15 µm.

7. A method to control a level of contaminants inside a sensitive device, the method comprising:
dispensing and curing a dispensable getter composition comprising an organic binder, a moisture sorber, and a hydrogen sorber, to obtain a cured dispensable getter composition,
wherein:
the hydrogen sorber is palladium oxide in an amount comprised between 5 wt % and 25 wt % of the weight of the dispensable getter composition;
the moisture sorber is a zeolite in an amount comprised between 35 wt % and 55 wt % of the weight of the dispensable getter composition;
the organic binder is in an amount comprised between 30 wt % and 50 wt % of the weight of the dispensable getter composition; and
the organic binder is a bisphenol resin chosen from type F, type S or mixtures thereof,
the dispensable getter composition further comprising up to 10 wt % of an additional material selected from curing agents, pigments, and stabilizers.

8. The method according to claim 7, wherein the cured dispensable getter composition is isolated from an environment outside of the sensitive device and has an average thickness comprised between 100 µm and 300 µm.

9. The method according to claim 7, wherein the cured dispensable getter composition is in contact with an environment outside the sensitive device and has an average thickness comprised between 1 mm and 4 mm.

10. The method according to claim 7, wherein the sensitive device is a hermetic or a semi-hermetic device.

11. The method according to claim 10, wherein the sensitive device is selected from the group consisting of optical transceivers, with particular reference to high-speed optical transceivers, optical receivers, and microwave GaAs-based modules.

12. The dispensable getter composition according to claim 1, wherein the dispensable getter composition comprises up to 5 wt % of the additional material and the thermal curing agent is no less than 1 wt %.

13. The method according to claim 7, wherein the dispensable getter composition comprises up to 5 wt % of the additional material and the thermal curing agent is no less than 1 wt %.

* * * * *